United States Patent [19]

Halleck

[11] 4,030,363
[45] June 21, 1977

[54] ELECTRONIC THERMOMETER

[75] Inventor: Michael E. Halleck, Boulder, Colo.

[73] Assignee: Electromedics, Inc., Denver, Colo.

[22] Filed: Oct. 28, 1975

[21] Appl. No.: 626,364

[52] U.S. Cl. .................. 73/362 AR; 340/347 AD
[51] Int. Cl.$^2$ .................. G01K 7/24; H03K 13/02
[58] Field of Search .............. 73/362 R, 362 AR; 235/92 MT; 340/347 AD, 347 NT, 347 M, 847, 677, 373

[56] References Cited

UNITED STATES PATENTS

| | | | |
|---|---|---|---|
| 3,111,662 | 11/1963 | Pierce | 340/347 AD |
| 3,217,144 | 11/1965 | Hinnah | 235/92 MT |
| 3,274,832 | 9/1966 | Hamilton | 73/339 R |
| 3,477,292 | 11/1969 | Thornton | 73/362 AR |
| 3,725,784 | 4/1973 | Bayer | 324/130 |
| 3,729,998 | 5/1973 | Mueller et al. | 73/362 AR |
| 3,766,782 | 10/1973 | Shimomura | 73/362 AR X |
| 3,768,310 | 10/1973 | Krepak | 73/362 AR |

Primary Examiner—Richard C. Queisser
Assistant Examiner—John S. Appleman
Attorney, Agent, or Firm—Gary M. Polumbus

[57] ABSTRACT

An electronic thermometer providing an improved means for controlling temperature readout. The thermometer incorporates analog-to-digital conversion utilizing a pulse width modulation technique. The temperature of a patient is taken for a given time interval and the last reading thereof is held for another given time interval. An adjustable oscillator provides clock pulses to a frequency divider one output of which triggers a saw tooth generator and other outputs of which are coupled to a decoder driving the display. The saw tooth generator provides an input to a reference comparator and a temperature measurement comparator the former of which receives a reference voltage and the latter of which receives a temperature sensitive voltage derived from circuitry which includes a thermistor. The outputs from the comparators are coupled through a hold-release circuit utilized to prevent erroneous readings due to premature release of an off-on switch, with the output from the hold-release circuit being coupled to the counter-display decoder to control the number of pulses therefrom fed through drivers to the digital readout display. The patient's temperature is continually displayed for a given time interval.

2 Claims, 8 Drawing Figures

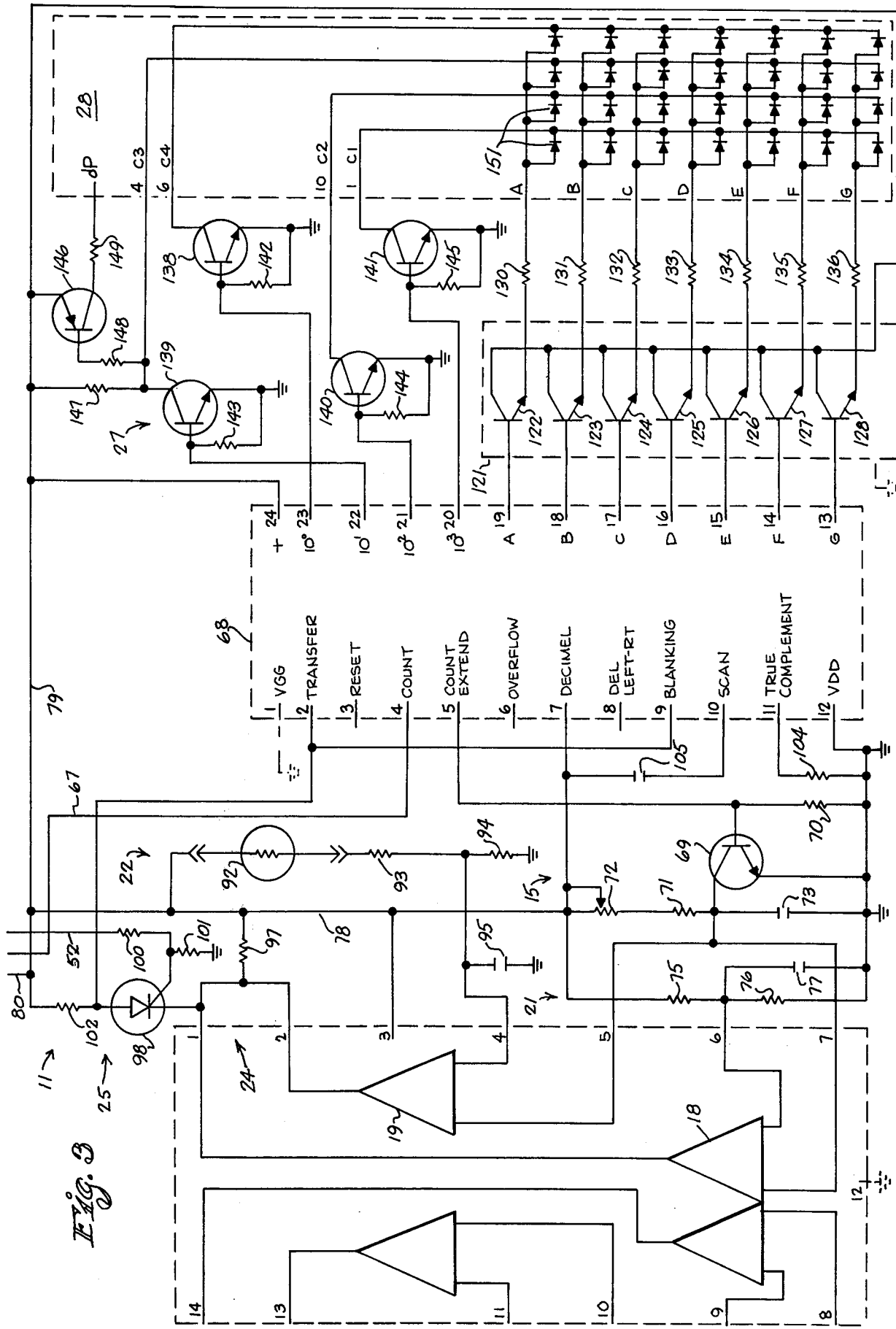

ELECTRONIC THERMOMETER

FIELD OF THE INVENTION

This invention relates to an improvement for electronic thermometer and more particularly relates to an electronic thermometer having digital readout.

BACKGROUND OF THE INVENTION

It is oftentimes necessary to accurately determine temperature and this is particularly true where the temperature of a human being is concerned. Over the years, a mercury fever of clinical thermometer has been widely utilized to measure the temperature of the human body. As is well known, this type of thermometer utilizes a glass tube having a mercury filled bulb at one end, with the tube being calibrated so that the height of the mercury in the tube enables the temperature to be read.

More recently, it has been suggested that an electronic thermometer could be utilized to accurately determine the temperature of the human body. Such thermometers have not, however, proved to be completely satisfactory for various reasons including, but not limited to, slow performance characteristics, size, complicate circuitry, accuracy, and/or reliability.

Examples of known electronic thermometers can be found in the following U.S. Pat. Nos. 3,077,111; 3,620,082; 3,729,998; 3,274,832; 3,695,112; 3,766,782; 3,461,724; 3,702,076; 3,768,310; 3,477,292.

SUMMARY OF THE INVENTION

This invention provides an improved electronic thermometer that utilizes pulse width modulation for analog to digital conversion and provides a digital output reading for both accuracy monitoring and temperature measurement. In addition, the electronic thermometer of this invention is of sufficiently small size so as to be readily useable for temperature measurement of human beings and is relatively simple yet accurate. An improved method is also provided for measuring temperature.

It is therefor an object of this invention to provide an improved electronic thermometer.

It is another object of this invention to provide an improved electronic thermometer having accurate digital readout.

It is yet another object of this invention to provide an improved electronic thermometer having accuracy monitoring as well as temperature readout.

It is yet another object of this invention to provide an improved electronic thermometer that includes a pair of comparators for providing a reference digital readout for accuracy monitoring as well as a temperature measurement comparator for the desired temperature readout.

It is still another object of this invention to provide an improved thermometer that includes an adjustable oscillator for triggering both a saw tooth generator and a decoder the output of which provides information to the digital readout display.

It is yet another object of this invention to provide an improved electronic thermometer having a hold-release circuit for precluding erroneous readings due to premature release of an off-on switch.

It is yet another object of this invention to provide a method for measuring temperature that includes accuracy calibration monitoring as well as temperature readout.

With these and other objects in view which will become apparent to one skilled in the art as the description proceeds, this invention resides in the novel construction, combination, and arrangement of parts substantially as hereinafter described and more particularly defined by the appended claims, it being understood that such changes in the precise embodiment of the herein disclosed invention are meant to be included as come within the scope of the claims.

BRIEF DESCRIPTION OF THE DRAWINGS

The accompanying drawings illustrate a complete embodiment of the invention according to the best mode so far devised for the practical application of the principles thereof, and in which;

FIG. 2 and 3 together form a partial electronic schematic and block diagram of the invention as shown in block form in FIG. 1;

DESCRIPTION OF THE INVENTION

Figure 1:
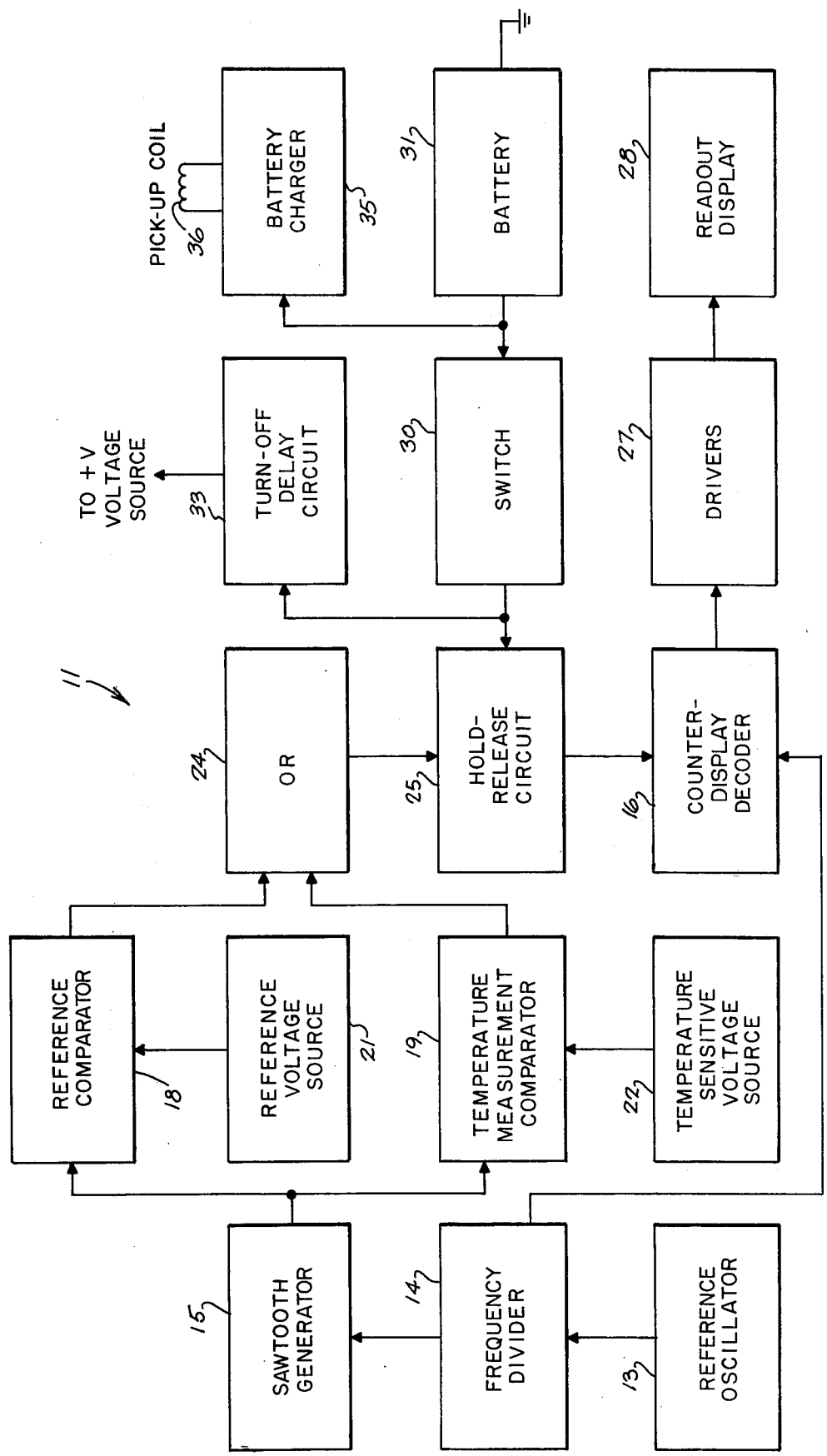
FIG. 1 is a block diagram of the improved electronic thermometer of this invention.

Referring now to the drawings, the numeral 11 indicates generally the improved electronic thermometer of this invention. As shown in the block diagram of FIG. 1, the electronic thermometer 11 includes a frequency stable reference oscillator 13 that provides a series of pulses to a frequency divider 14. Oscillator 13 is conventional and operates at a frequency $F_o$ while a conventional frequency divider 14 divides the reference frequency $F_o$ by N to thus supply a pulse every $F_o/N$ Hertz to a saw tooth, or slope, generator 15. The saw tooth generator 15 may also be conventional and supplies a linearly varying upwardly sloping, ramp voltage output. The frequency divider 14 also provides a series of outputs at different predetermined frequencies (see FIGS. 5 and 6) to counter-display decoder 16.

The output from saw tooth generator 15 is coupled to a reference comparator 18 and to a temperature measurement comparator 19. A second input to the reference comparator 18 is provided from a reference voltage source 21, while a second input to the temperature measurement comparator 19 is supplied from a temperature sensitive voltage source 22. The comparators and voltage sources may likewise be conventional, and as is well known, each comparator changes binary state when the input voltage from the saw tooth generator 15 reaches that of the second input, i.e., the reference voltage from reference voltage source 21 for the reference comparator 18 or the voltage indicative of sensed temperature at source 22 for the temperature measurement comparator 19. Thus, the width of the pulses produced by the comparators reflects the time interval it takes for the saw tooth voltage to build to the respective voltage received at the second input to the comparator.

The outputs from the reference comparator 18 and the temperature measurement comparator 19 are coupled through an OR-gate 24 to a hold-release circuit 25, the output from the hold-release circuit 25 being coupled to a counter-display decoder 16 to control the number of timing pulses applied through drivers 27 to drive readout display 28.

Power to the electronic thermometer is controlled by a switch 30 connected to a battery 31. Switch 30 is connected to the hold-release circuit 25 with the hold-release circuit 25 assuring that any premature release of switch 30 will not result in erroneous readouts of the readout display 28. Switch 30 is also connected through turn-off delay circuit 33 to +V voltagesource providing power to the various components of the electronic thermometer 11. In addition, the battery 31 is connected to a battery charger 35 having a pickup coil 36. This enables the battery to be recharged from an external source (not shown) for proper continued operation of the thermometer.

Figure 2:
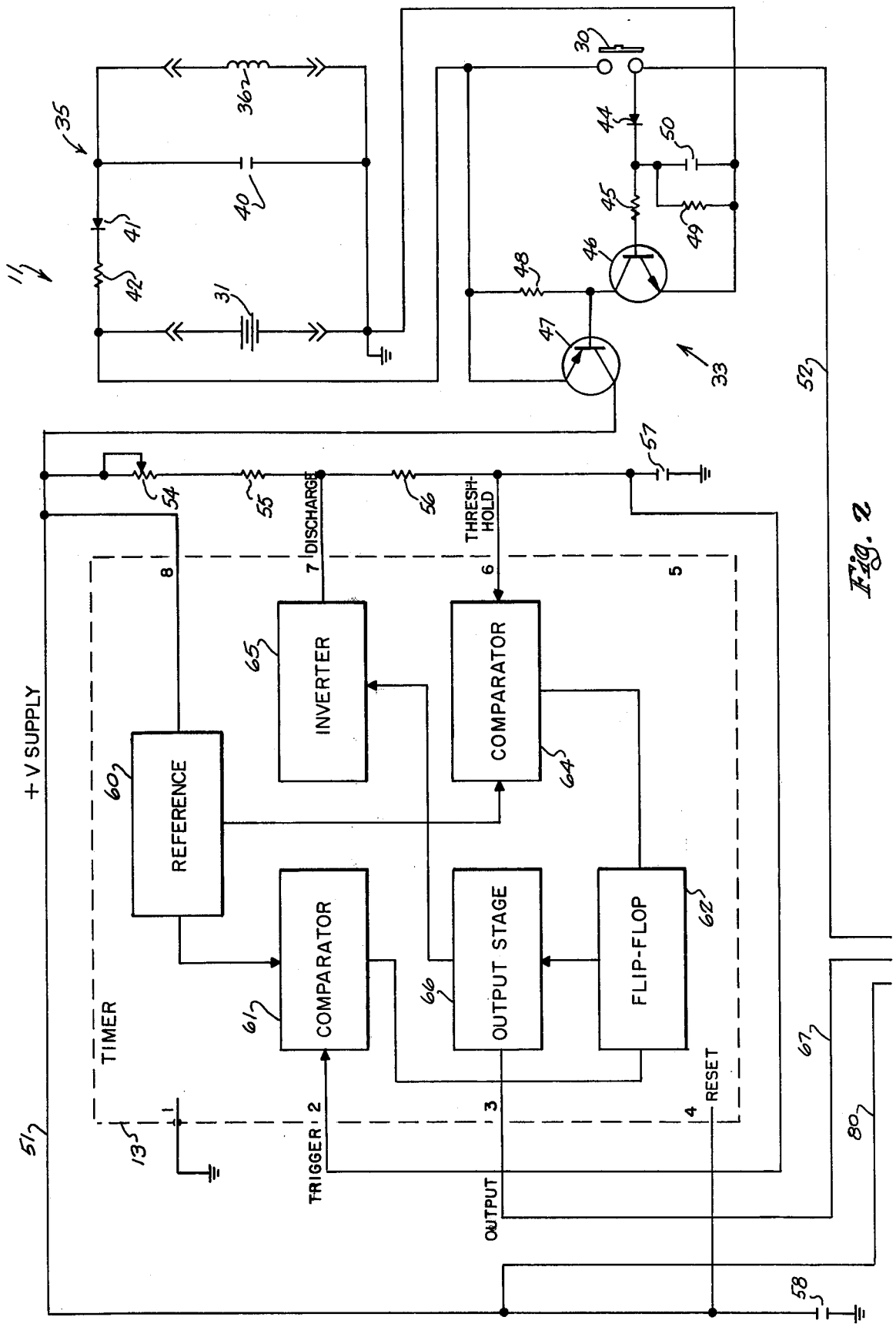

Turning now to FIGS. 2 and 3, which taken together provide an expanded partial electronic schematic and partial block diagram of the electronic thermometer 11, the battery 31 is shown connected to a ground at its negative terminal (the battery being indicated in FIG. 2 is removable). The battery charger 35 is connected across battery 31 and includes the pickup coil 36 which is also indicated as being removable. Pickup coil 36 has a capacitor 40 connected in parallel therewith with one side of the junction of the pickup coil 36 and capacitor 40 being grounded while the other side is coupled to the positive side of battery 31 through a diode 41 and a resistor 42.

Battery 31 is preferably rechargeable nickel-cadmium battery which supplies 6.25 volts at 50 ma to the thermometer circuitry. The nominal charge rate for the battery is a constant 5 ma for 14 to 16 hours or a 0.5 ma trickle charge. The battery charger 35 is preferably utilized with an external line operated generator (not shown) oscillating at approximately 30 kHz which drives a transmitter coil (not shown) with a 200 volt peak-to-peak signal which is magnetically coupled to battery charger 35 via inductor coil 36 (the line operated generator and transmitter coil may thus be outside the casing or housing (not shown) of the thermometer 11). The coil 36 and the capacitor 40 form a tuned circuit which resonates at approximately 30 kHz (where an external line operated generator oscillating at 30 kHz is to be utilized). The signal coupled to coil 36 is rectified by diode 41 and charges the battery through resistor 42. If desired, a 5 ma constant current diode could be substituted for resistor 42.

The positive side of battery 31 is connected through switch 30 to turn off delay circuit 33. As shown in FIG. 2, depressing the movable contact of switch 30 establishes an electronic connection between the fixed contacts to supply the battery voltage through a diode 44 and a resistor 45 to the base of a transistor 46. The collector of transistor 46 is connected to the base of a transistor 47, the collector of which transistor supplies the +V supply voltage for the thermometer electronic circuitry. The junction of the diode 44 and resistor 45 has a parallel connected resistor 49 and a capacitor 50 to ground connected therewith. As shown in FIG. 2, the +V voltage supply supplied to the electronic thermometer 11 is supplied on lead 51 connected with the collector of transistor 47, while lead 52, as shown in FIGS. 2 and 3, couples the battery output to the hold-release circuit 25 through lead 52 connected to switch 30.

The turn-off delay circuit 33 allows a digital readout for approximately ten seconds after the on-off push button switch 30 is released. When switch 30 is depressed, current flows through diode 44 to charge capacitor 50 to the battery voltage. Transistor 46 saturates and turns on the transistor 47 which supplies the +V voltage at the collector to all of the thermometer circuitry over lead 51. After the switch 30 is released, capacitor 50 discharges toward ground through resistors 45 and 49 until transistor 46 turns off (when approximately 0.5 volt DC is applied to the base of transistor 46). At this point, the voltage at the collector of the transistor 47 becomes zero, and the power to the thermometer electronic circuitry is, of course, terminated. The resistor 48 reduces leakage from transistor 47 to a negeligible value while transistor 47 is in the nonconductive, or off, condition, while diode 44 prevents discharging of capacitor 50 through the hold-release circuitry 25. The turn-off delay provided by turn-off delay circuit 33 is determined by the time constant of resistors 45 and 49 and capacitor 50, and is preferably set to be approximately 10 seconds as brought out hereinbelow.

Referring now to reference oscillator 13, this oscillator is shown in more detail in block form in FIG. 2. The +V voltage supply on lead 51 is coupled through a series connected potentiometer 54, a resistor 55 and a resistor 56 to charge a capacitor 57, the other side of which circuit is grounded. As also indicated in FIG. 2, the +V voltage supply on lead 51 is also connected to one side of a capacitor 58, the other side of which capacitor is also grounded. As is conventional, oscillator 13 is connected for astable operation and includes reference 60 the output of which is coupled to comparator 61. The output from the comparator 61 is coupled through a flip-flop 62 which is also connected with the comparator 64. Inverter 65 is connected with an output stage 66 which output stage also supplies an output pulse which is a negative going pulse to decoder 16 through lead 67, as shown in FIGS. 2 and 3.

The charge time ($t_1$) of capacitor 57 is equal to .685 (Pt. 54 + R55 + R56) C57. The discharge time ($t_2$) is equal to .685 (R56)(C57). The period (T) is equal both to $t_1$ and $t_2$, with the frequency, of course, being the reciprocal of the period (T). Potentiometer 54 is adjusted so that the oscillator frequency is proportional to temperature.

Referring now to the saw tooth generator 15, which is shown in schematic form in FIG. 3, the saw tooth generator 15 includes a transistor 69 the base of which receives the input from the decoder 68. In addition, the base of transistor 69 is connected to ground through resistor 70, while the collector of transistor 69 is connected to the +V voltage supply through series connected resistor 71 and potentiometer 72, the collector also being connected to one side of a capacitor 73, the other side of which capacitor is connected to ground. Capacitor 73 charges toward the supply voltage through resistor 71 and potentiometer 72. When a positive pulse is received from the frequency divider-decoder 68 at the base of transistor 69, capacitor 73 discharges to ground. Capacitor 73 again charges and is discharged by the next positive pulse into the base of transistor 69 (which transistor is a Darlington transistor). Potentiometer 72 is used to adjust the amplitude of the saw tooth voltage at the collector of transistor 69 with the frequency being determined, of course, by reference oscillator 13.

To provide the reference voltage input to the reference comparator 18, the reference voltage source 21 includes a pair of series connected resistors 75 and 76 connected as a voltage divider between the +V power supply and ground, with resistor 76 having a capacitor 77 connected in parallel therewith. As shown in FIGS. 2 and 3, resistor 75 is connected at one side to the +V voltage supply through leads 78, 79 and 80, the latter of which is connected to lead 51. The output of the negative input of the comparator 18 is coupled from the junction of resistors 75 and 76, as indicated in FIG. 3, with capacitor 77 providing filtering. With resistors 75 and 76 of equal value, the reference voltage supplied to comparator 18 is one-half the +V supply voltage. The second input to comparators 18 and 19 is provided from the collector of transistor 69, and hence from the saw tooth generator 15, this input to comparators 18 and 19 being coupled to the plus input as indicated in FIG. 4.

Figure 4:
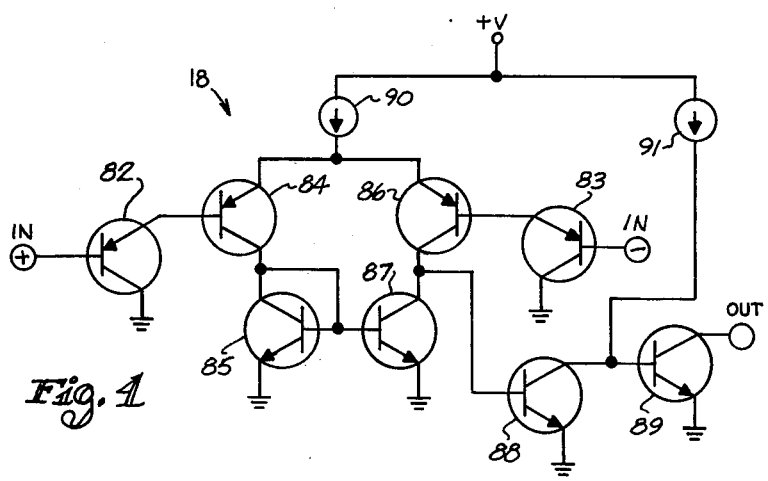
FIG. 4 is an electronic schematic of a comparator as shown in block form in FIG. 1.

As shown in FIG. 4, comparator 18 (comparator 19 may be identical) includes a plurality of transistors with the plus input to the comparator being connected to the base of transistor 82 and the minus input being coupled to the base of transistor 83. The collectors of transistors 82 and 83 are grounded, while the emitter of transistor 82 is connected to the base of a transistor 84, and the collector of transistor 84 is connected to the collector of transistor 85. The emitter of transistor 83 is connected to the base of transistor 86, and the collector of transistor 86 is connected to the collector of transistor 87. The emitters of transistors 85 and 87 are grounded, while the emitters of transistors 84 and 86 are connected to 100 ma meter 90 connected to the +V voltage supply. The output from the comparator is taken from the collectors of transistors 86 and 87 and coupled to the base of transistor 88, the collector of which transistor is connected to the base of transistor 89 with the comparator output then being taken from the collector of transistor 89. In addition, the junction of the collector of transistor 88 and the base of transistor 89 is also connected through 100 ma meter 91 to the +V voltage power supply.

As shown in FIG. 3, comparators 18 and 19 may be included in a dual comparator circuit (the circuit having extra varied capacity as shown in FIG. 3 when a LM339N or MC3302P is utilized). The negative input to comparator 19 is coupled from temperature sensitive voltage source 22 which includes a thermistor 92 (which is indicated to be removable), resistor 93 and resistor 94 being connected in series as a voltage divider between the +V voltage supply and ground. The output from the circuit is taken from the junction of resistors 93 and 94 and coupled to the negative input of comparator 19. A bypass capacitor 95 is connected between the junctions of the resistors 93 and 94 to ground. As is well known, the resistance of the thermistor 92 will vary inversely with temperature and hence the output from temperature sensitive voltage source 22 coupled to comparator 19 will depend upon the temperature sensed by the thermistor.

The outputs from compartors 18 and 19 are coupled through OR-gate 24 to the hold-release circuit 25 as shown in FIG. 3. A resistor 97 is connected between the +V voltage source and the outputs of comparators 18 and 19. The output from the comparators is coupled through an SCR 98 in hold-release circuit 25. As brought out hereinabove, the battery 31 is connected to the hold-release circuit 25 through lead 52, and more particularly, lead 52 is connected to one side of a resistor 100 the other side of which is connected to ground through resistor 101 and to the trigger input of the SCR 98. SCR 98 is also connected to the +V voltage supply through lead 80 and resistor 102. Referring now to the frequency divider-decoder 68 as shown in FIG. 3, the divider-decoder 68 has pin 11 thereof connected through a resistor 104 to ground while pin 10 is connected to the +V voltage source through capacitor 105.

Figure 5:
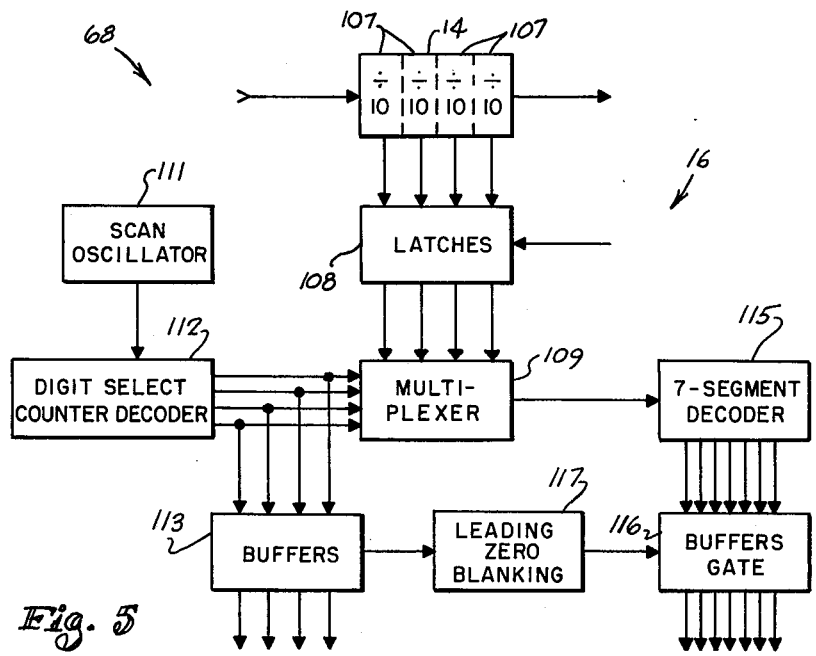
FIG. 5 is an expanded block diagram of the frequency divider and counter display decoder shown in block form in FIG. 1.
Figure 6:
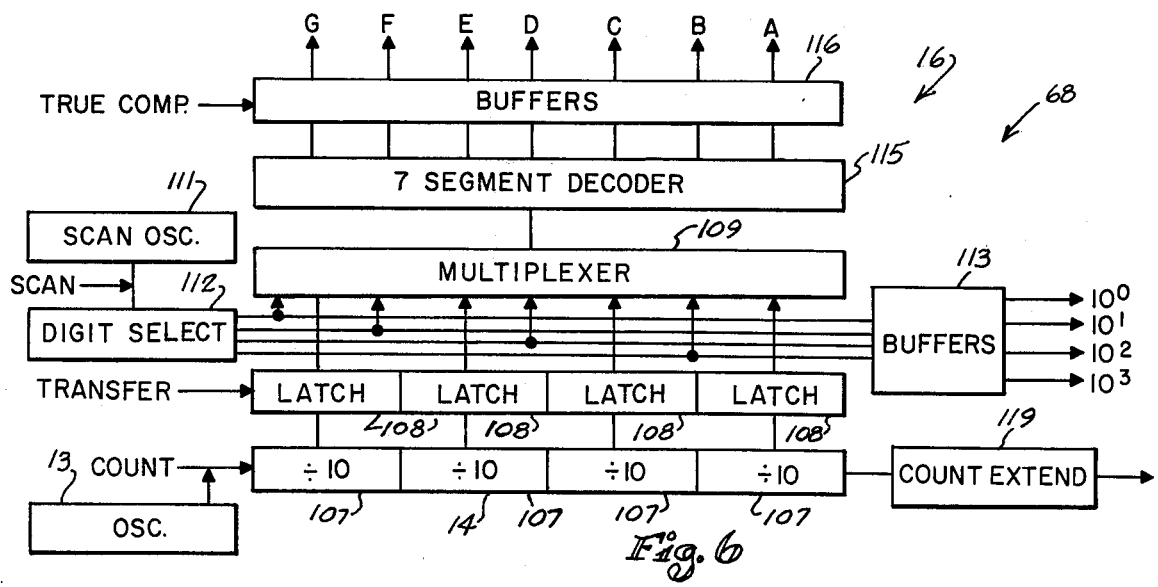
FIG. 6 is still further expanded block diagram of the frequency divider and counter display decoder shown in block form in FIGS. 1 and 5.

Referring now to FIGS. 5 and 6 where expanded block diagrams of divider-decoder 68 are shown in more detail, frequency divider 14 is shown to include a plurality of four divide by 10 ($\div$ 10) circuits 107, the output of the last of the $\div$10 circuits being coupled to the saw tooth generator 15 while each of the $\div$10 circuits provides an output to latches 108, as shown in FIG. 5. The output from the hold-release circuit 25 is also coupled to latches 108, and the output from latches 108 is coupled to multiplexer 109 which also receives an input controlled by scan oscillator 111 coupled to digit select counter decoder 112, connected with the multiplexer 109. The output from digit select counter decoder 112 is coupled through buffers 113 to drivers 27, while the output of the multiplexer 109 is coupled to a seven segment decoder 115 the output of which is coupled through buffer gates 116 to drivers 27. In addition, the outputs from buffers 113 are coupled through a leading zero blanking circuit 117 the output of which is coupled to buffers gate 116, as indicated in FIG. 5.

The divider-decoder 68 is shown in more detail in FIG. 6 where it is shown that oscillator 13 provides a count input to the frequency divider 14 and more particularly into the first $\div$10 unit 107 thereof. The output of the last $\div$10 unit is count extend 119 which is coupled to the saw tooth generator 15 as indicated best in FIG. 3. Each $\div$10 unit 107 is coupled to a separate latch 108 which receives a transfer input from the hold-release circuit 25. Scan oscillator 111 is coupled to a digit select 112 with a scan input also coupled thereto and the output from the digit select 112 is coupled to the multiple inputs of multiplexer 109, and through multiple inputs to buffers 113. Buffers 113 then provides the $10^0$, $10^1$, $10^2$ and $10^3$ inputs to the drivers 27 as indicated in FIG. 6. The output of multiplexer 109 is supplied to the seven segment decoder 115 which supplies seven inputs to buffers 116, the buffers also receiving a true component input as indicated in FIG. 5, and providing outputs A through G as indicated in FIG. 6, which outputs are coupled to drivers 27 as shown best in FIG. 3.

The negative clock pulses supplied to the count input of decoder 16 from reference oscillator 13 on lead 67 are divided by 10,000 prior to being coupled from the frequency divider to the saw tooth generator 15. In addition, the clock pulses coming into the count input of decoder 16 are counted and decoded and then coupled from outputs A through G (pins 13 to 19) into a seven segment output and a digit select output $10^0$-$10^3$ (pins 23-20) when the transfer input is in a high state (that is, supplied with the +V voltage). This same clock pulse is held and displayed when the transfer is in the low state (that is, at 0 volts). The true complement input to decoder 16 when at zero volts, will yield a normal seven segment output and when at +V volts, the output will be inverted. Capacitor 105 determines the scan rate of the internal oscillator within decoder 68.

Referring now to FIG. 3, the output from decoder 16 is coupled to drivers 27. These drivers include a plurality of transistors. As indicated in FIG. 3, the A through G outputs from decoder 16 are coupled to the integrated circuit 121 which includes a plurality of seven transistors 122 through 128 with the inputs from the decoder 16 being coupled to the base of each of the transistors. The collector of each transistor is connected to the +V voltage through lead 79 while the emitters are connected through resistors 130 through 136 to the inputs to readout display 28.

The $10^0$-$10^3$ inputs are coupled to transistors 138, 139, 140 and 141 of drives 27, as also indicated in FIG. 3. Each of these transistors has a resistor 142, 143, 144 and 145, respectively, connected to the base and emitter and each emitter is grounded, while the collectors are connected to the display readout 28. In addition, the collector of transistor 139 is connected to transistor 146 with the collector of transistor 139 being connected through transistor 147 to the +V voltage supply and through resistor 148 to the base of transistor 146. The collector of transistor 146 is connected through resistor 149 to the readout display 128. As indicated in FIG. 3, the readout display conventionally includes a plurality of diodes 151 for providing the readout in visual form as a digit, and preferably, a four digit readout. Readout 128 is preferably an LED display and driver 27 supplies sufficient current to drive this display with resistors 130 through 136 limiting the current to the LED displays and therefore limiting the light intensity therefrom.

Components that may be utilized in the electronic thermometer of this invention are as follows, it being realized that the particular components listed are meant to be illustrative and the invention is not meant to be limited thereto:

Reference Oscillator (13) — NE555 Timer
Capacitors (18 and 19) — 1/4LM339N
Readout Display (28) — HP5082-7414
Battery Charger Tuned Circuit (L36-C40) — Resonate at 30 kHz.
Frequency Divider-Counter Decoder (68) — Mostek 5005P 4 Digit Converter Decoder.
Capacitors (in uFd) — 50—1016; 57—470pF; 58—1016; 73—0.1; 77—1; 95—1; and 105—.005.
Resistors (in ohms) — 45—220K; 48—100K; 49—1-meg; 55—4.7K; 56—1.5K; 70—10000K; 71—68K; 75—10K; 76—10K; 93—3.3K; 94—10K; 97—47K; 100—10K; 101—1.5K; 102—1.5K; 104—10; 130 to 136—1.5K; 142 to 145—100K; 147—13K; 148—100K; and 149—1.5K.
Thermistor (92) —10K.
Potentiometers (in ohms)—54—14K; 72—10K.
Diodes — 41—IN914 and 44—IN914.
Transistors — 46—2N3904; 27—2N3905; 69—MPSA12; 138 to 141—2N3904; and 146—2N3905.
SCR—(98)—2N5062.
Seven Transistor Driver (121) — CA3082 or ULN—2082A.

In operation, analog to digital conversion is utilized with a pulse width modulation technique incorporated in the temperature measurement mode. The electronic circuit utilized enables reduction of component complexity so that the electronic components can be mounted on a small board that is approximately 1.2 inches by 3.2 inches.

Figure 7:
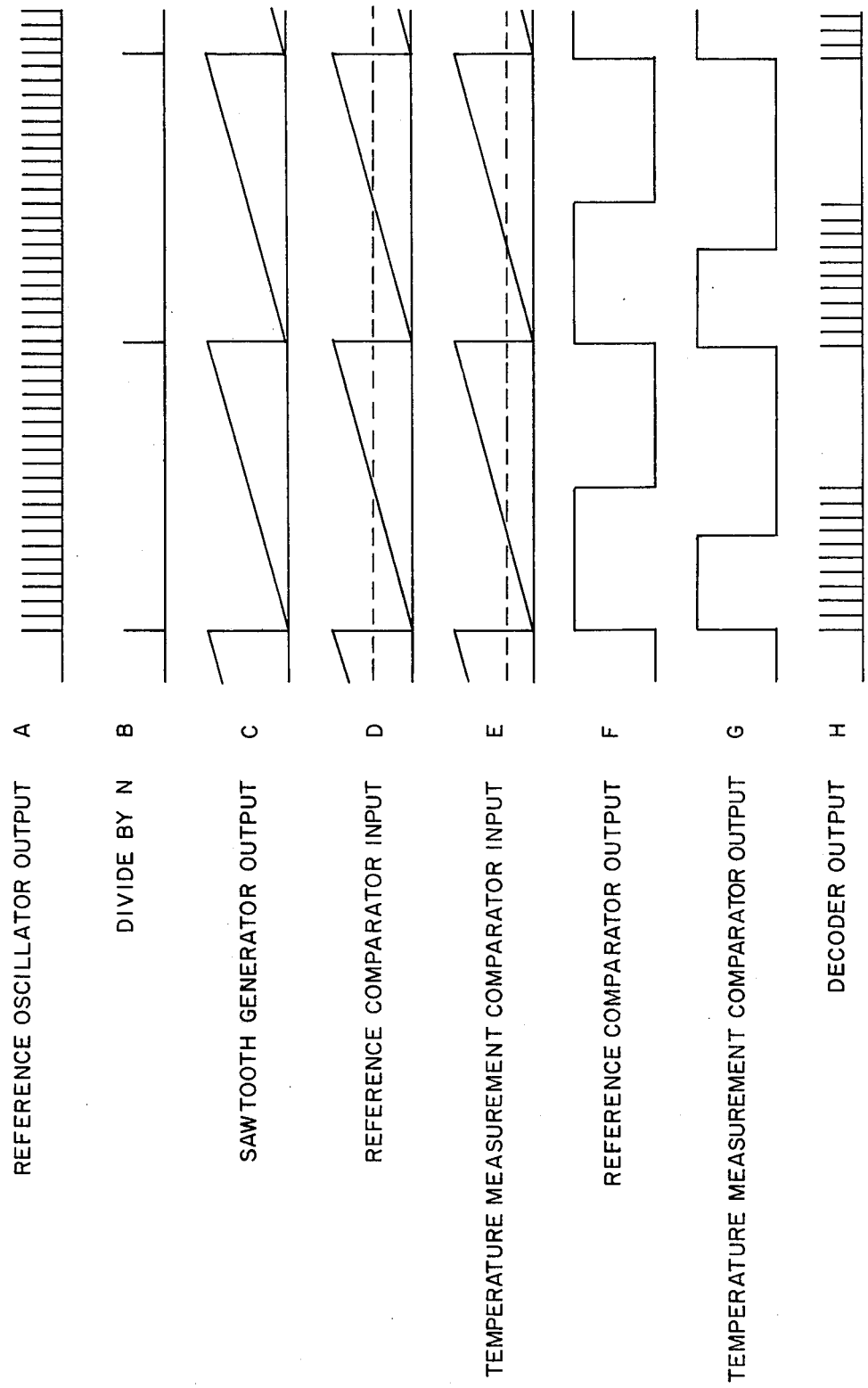
FIG. 7 is a series of wave forms illustrating operation of the electronic thermometer in the calibration accuracy monitoring mode.

This invention allows for monitoring of calibration accuracy as well as temperature measurement. As shown in FIG. 7, the reference oscillator output ($F_0$) from reference oscillator 13 (FIG. 7A) is divided by N (FIG. 7B) and a timing pulse coupled to saw tooth generator 15 to produce the saw tooth generator output shown in wave form 7C. For reference monitoring, a reference comparator voltage input is supplied to reference comparator 18. As shown, the inputs to comparator 18 are therefore the saw tooth generator linearly varying voltage and the reference voltage (indicated by the dotted line in FIG. 7D). As is well known, the reference comparator output will shift state when the upwardly sloping saw tooth voltage reaches the magnitude of the reference voltage as indicated in FIG. 7F. Thus, calibration accuracy monitoring is initially accomplished after turning on the electronic thermometer by depressing switch 30 (and prior to the time that the temperature measurement comparator provides an output that has an input greater than that of the reference oscillator). As indicated in FIG. 7E, when the temperature comparator input voltage, the pulse width of the waveform from the temperature measurement comparator (see FIG. 7G) will be of shorter duration than the pulse width of the waveform from the reference comparator (see FIG. 7F) and the decoder output (as shown in FIG. 7H) will be controlled by the output from the reference comparator. This provides a visual display which can be monitored for accuracy of a predetermined output appearing on the display. If the output is incorrect, then adjustment as indicated to be necessary by calibration monitoring. While any number might be selected by component selection in the reference comparator, it has been found that a reference number between 88.0° F. and 95.0° F. is preferred. If the calibration number is wrong, appropriate adjustment of potentiometer 54 may be made to re-calibrate the thermometer.

Figure 8:
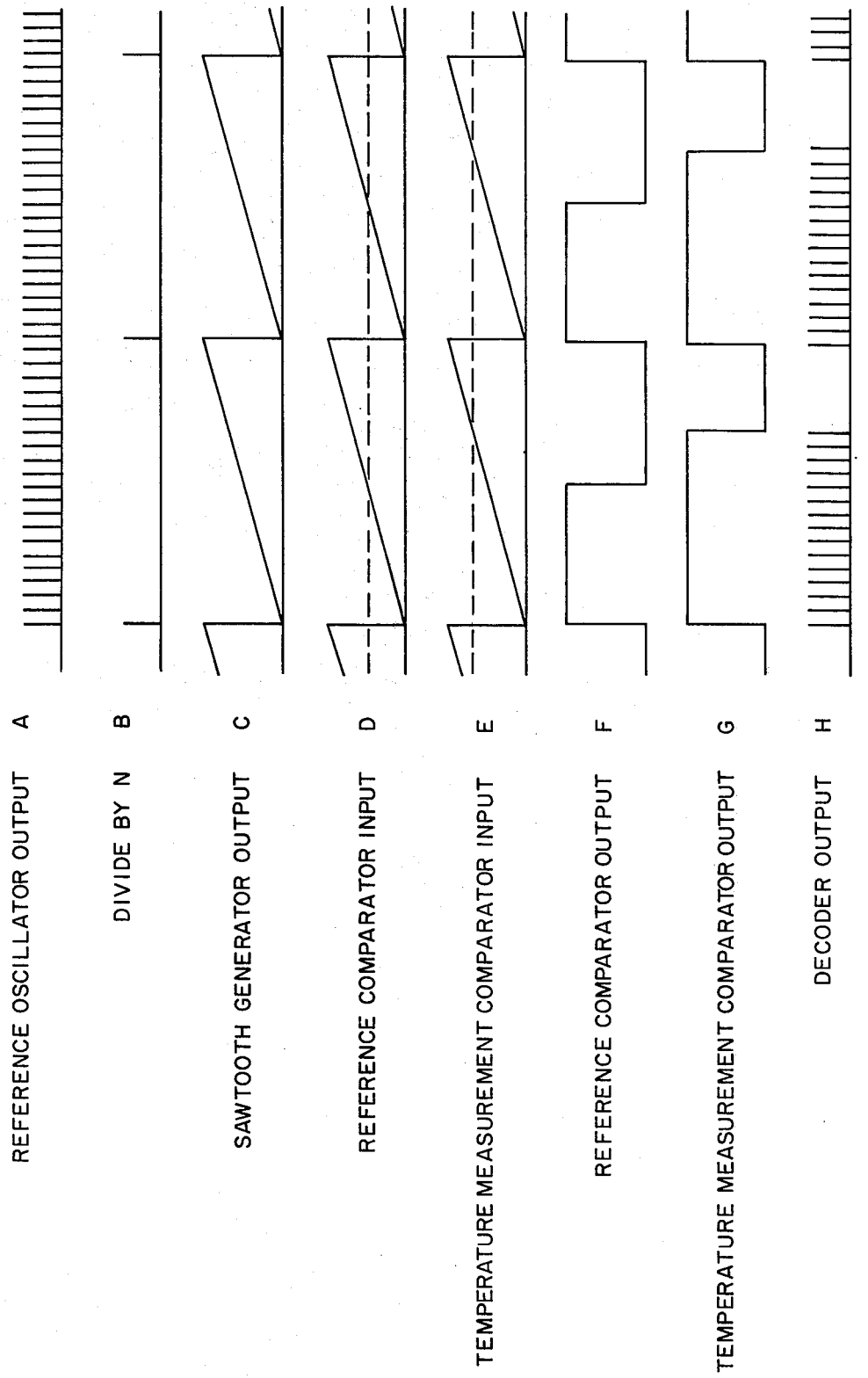
FIG. 8 is a series of wave forms illustrating operation of the electronic thermometer in the digital temperature readout mode.

As shown in FIG. 8, after the temperature measurement comparator input is greater than that of the reference, (see FIGS. (D and 8E), then temperature measurement indications will be supplied to the visual readout 28. As indicated in FIGS. 8F and 8G, when the sensed voltage due to temperature measurement is higher than that of the reference voltage, then the reference comparator output will be less than that of the temperature measurement comparator output, and hence the decoder output, as shown in FIG. 8H, will be that of the temperature measurement comparator output. When the sensed temperature has stabilized, the reading of the display 28 will be that of the temperature measurement.

As indicated hereinabove, the comparator outputs are gated to the hold-release circuit and then into the four digit counter-display decoder 16. When the pulse output of a comparator is in the high state, the counter display decoder counts the number of pulses gated in from the reference oscillator. When the pulse output of the comparators is in the low state, the counter display decoder holds and displays the number of pulses from the reference oscillator.

When the on-off switch 30 of the thermometer is pressed, the turn-off delay circuit 33 becomes energized and supplies power to the thermometer for a predetermined number of seconds after the switch is released. This enables the thermometer to display on the LED display readout 28 the temperature indication for a predetermined number of seconds after the reading has been taken (about ten seconds having been found to be preferable). This is accomplished by choosing appropriate values, for resistor 49 and capacitor 50. Any additional TRANSFER signals are prevented due to the turning-off of SCR 98.

When the off-on switch 30 is released, it can be possible for the LED to display an erroneous reading if the switch is released during the time the output of the reference or temperature measurement comparators are in the high, or count, state. The probability of this occurring will be in the ratio of the comparator output pulse width to pulse duration (approximately 1 to 12). In order to reduce the probability of a false reading after release of the off-on switch, a hold-release circuit is inserted between the OR-gate 24 and the latch input to counter-display decoder. This circuit allows the outputs of the comparators to complete their final count even if the off-on switch 30 is released during the high count state of the comparator outputs. Therefore, the probability of a false reading after the release of the off-on switch is precluded.

In view of the foregoing, it is felt that this invention provides a small yet reliable electronic thermometer that provides digital readout for both temperatures measurement readout and calibration accuracy monitoring.

I claim:

1. In an electronic thermometer having means for displaying a patient's temperature, an activation switch, means responsive to said patient's temperature for generating an analog temperature measurement signal, means for generating an analog reference signal, and means comparing said analog temperature measurement signal with said analog reference signal for controlling said display means, an improvement to said controlling means comprising:

oscillator means for generating a plurality of clock pulses;

frequency divider means responsive to said clock pulses for generating a first series of timing pulses and for generating a second series of timing pulses;

saw tooth generator means operative upon receipt of each timing pulse of said first series of timing pulses for producing a saw tooth pulse;

first comparator means, simultaneously receptive of each said saw tooth pulse and of said analog reference signal, for outputting a first control signal when the amplitude of said saw tooth pulse equals the amplitude of said analog reference signal;

second comparator means, simultaneously receptive of each said saw tooth pulse and of said analog temperature measurement signal, for outputting a second control signal when the amplitude of said saw tooth pulse equals the amplitude of said analog temperature measurement signal;

counting means responsive to said second series of timing pulses for counting timing pulses of said second series, the number of said counted pulses being related to the temperature displayed by said display means;

activating means, cooperative with said counting means and responsive to said first and second control signals and the number of said counted pulses, for activating said display means to display a temperature;

said activating means being responsive to said first control signal when the amplitude of said analog temperature measurement signal is less than the amplitude of said analog reference signal for activating said display means to display a calibration temperature, and said activating means being responsive to said second control signal when the amplitude of said analog temperature measurement signal is greater than the amplitude of said analog reference signal for activating said display means to display a measured temperature of said patient;

adjustment means for adjusting the frequency of generation of clock pulses by said oscillator means to adjust the calibration temperature displayed to a preselected desired calibration temperature; and presenting means responsive to the release of said activation switch for presenting only the last reading to said display means for a predetermined time interval, wherein said presenting means comprises a capacitor responsive to the activation of said activation switch for charging up to a supply voltage value and a discharge circuit responsive to said charged capacitor for supplying power to said controlling means after said activation switch is released.

2. The thermometer of claim 1 further comprising means responsive to the release of said activation switch for continuing the input of said second series of timing pulses to said counting means until a complete temperature measurement is made.

* * * * *